United States Patent
Park et al.

(10) Patent No.: US 9,474,169 B2
(45) Date of Patent: Oct. 18, 2016

(54) DISPLAY DEVICE

(71) Applicant: LG ELECTRONICS INC., Seoul (KR)

(72) Inventors: Jungmin Park, Seoul (KR); Wanjune Kang, Seoul (KR); Namhun Kim, Seoul (KR); Dongho Ham, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/444,578

(22) Filed: Jul. 28, 2014

(65) Prior Publication Data

US 2015/0146390 A1    May 28, 2015

(30) Foreign Application Priority Data

Nov. 26, 2013 (KR) .................. 10-2013-0144835

(51) Int. Cl.
*H05K 5/00* (2006.01)
*G02F 1/1333* (2006.01)
*H05K 5/03* (2006.01)
*G02F 1/1335* (2006.01)

(52) U.S. Cl.
CPC ....... *H05K 5/0017* (2013.01); *G02F 1/133308* (2013.01); *H05K 5/03* (2013.01); *G02F 1/133528* (2013.01); *G02F 2001/133311* (2013.01); *G02F 2001/133314* (2013.01)

(58) Field of Classification Search
CPC ............... G02B 6/005; G02B 6/0088; G02F 1/133512; G02F 2001/133314

USPC ......... 361/752, 753, 760; 174/260, 256, 268
See application file for complete search history.

(56) References Cited

U.S. PATENT DOCUMENTS

| | | |
|---|---|---|
| 2009/0237583 A1* | 9/2009 | Chol .............................. 349/58 |
| 2012/0050639 A1* | 3/2012 | Kim et al. ...................... 349/58 |
| 2012/0092585 A1* | 4/2012 | Byeon et al. ................... 349/58 |
| 2012/0140141 A1* | 6/2012 | Lee et al. ......................... 349/59 |
| 2014/0160694 A1* | 6/2014 | Yoon et al. .................... 361/749 |

FOREIGN PATENT DOCUMENTS

| | | |
|---|---|---|
| EP | 2 570 844 A2 | 3/2013 |
| EP | 2 639 632 A1 | 9/2013 |

OTHER PUBLICATIONS

European Search Report dated Apr. 21, 2015 issued in Application No. 14003776.3.

* cited by examiner

*Primary Examiner* — Yuriy Semenenko
(74) *Attorney, Agent, or Firm* — KED & Associates LLP

(57) ABSTRACT

A display device may include a display module and a back cover positioned in a rear of the display module. The display module may include a display panel that includes a front substrate and a back substrate positioned opposite the front substrate, a film attached to a front surface of the front substrate, and a frame positioned in the rear of the back substrate. The film may include a first part that covers the front surface of the front substrate and a second part that extends from the first part and covers the side of the display module. At least a portion of each of the first part and the second part of the film is exposed.

22 Claims, 31 Drawing Sheets

DISPLAY DEVICE

CROSS-REFERENCE TO RELATED APPLICATION

This application claims the benefit of Korean Patent Application No. 10-2013-0144835, filed Nov. 26, 2013, the entire subject matter of which is hereby incorporated by reference.

BACKGROUND

1. Field

Embodiments may relate to a display device.

2. Background

With development of an information society, demands for display devices have been increasing. Display devices, such as liquid crystal displays (LCDs), plasma display panels (PDPs), electroluminescent displays (ELDs), and vacuum fluorescent displays (VFDs), have been studied and used to meet various demands for the display devices. Among the display devices, a liquid crystal display panel of the liquid crystal display may include a liquid crystal layer, and a thin film transistor (TFT) substrate and a color filter substrate that are positioned opposite each other with the liquid crystal layer interposed therebetween. The liquid crystal display panel may display an image using light provided by a backlight unit of the liquid crystal display.

BRIEF DESCRIPTION OF THE DRAWINGS

Arrangements and/or embodiments may be described in detail with reference to the following drawings in which like reference numerals refer to like elements and wherein.

DETAILED DESCRIPTION

Figure 1:
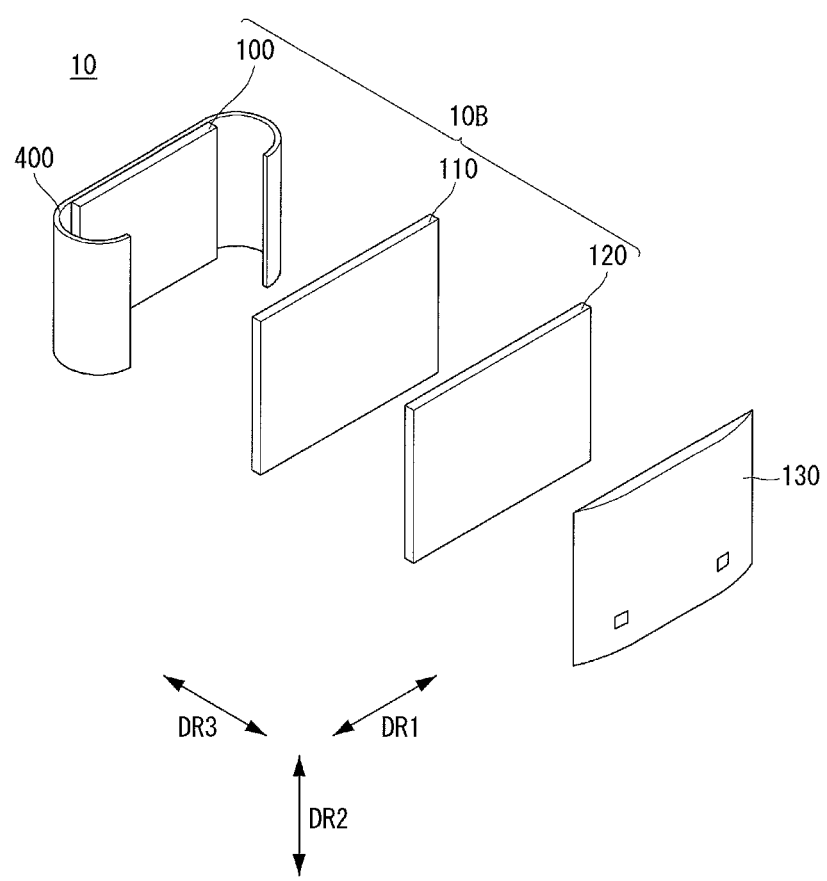
FIGS. 1 to 35 illustrate configurations of a display device according to exemplary embodiments.

Reference may now be made in detail embodiments, examples of which may be illustrated in the accompanying drawings. Since embodiments may be modified in various ways and may have various forms, specific embodiments are illustrated in the drawings and are described in detail. However, it should be understood that embodiments are not limited to specific disclosed embodiments, but include all modifications, equivalents and substitutes included within the spirit and technical scope of embodiments.

The terms 'first', 'second', etc. may be used to describe various components, but components are not limited by such terms. The terms are used only for the purpose of distinguishing one component from other components. For example, a first component may be designated as a second component without departing from the scope of embodiments. In the same manner, the second component may be designated as the first component.

The term "and/or" may encompass both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application may be used to describe only specific embodiments or examples, and are not intended to limit embodiments. A singular expression may include a plural expression as long as it does not have an apparently different meaning in context.

The terms "include" and "have" may be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms that are used herein, including the technical or scientific terms, have the same meanings as those that are generally understood by a person having ordinary knowledge in the art to which embodiments pertain. The terms defined in a generally used dictionary must be understood to have meanings identical to those used in the context of a related art, and are not to be construed to have ideal or excessively formal meanings unless they are obviously specified in the present application.

The following exemplary embodiments are provided to those skilled in the art in order to describe embodiments more completely. Accordingly, shapes and sizes of elements shown in the drawings may be exaggerated for clarity.

Hereinafter, a liquid crystal display panel may be used as an example of a display panel. Other display panels may also be used. For example, a plasma display panel (PDP), a field emission display (FED) panel, and an organic light emitting display panel may be used and/or provided.

FIGS. 1 to 35 illustrate configurations of a display device according to exemplary embodiments. Other embodiments and configurations may also be provided.

In the embodiments, a transverse direction (i.e., a direction parallel to a long side) of a display device 10 may be referred to as a first direction DR1; a longitudinal direction (i.e., a direction parallel to a short side) of the display device 10 may be referred to as a second direction DR2; and a direction vertical to the display device may be referred to as a third direction DR3.

The third direction DR3 may be referred to as a vertical direction, and the first direction DR1 and the second direction DR2 may be referred to as a horizontal direction.

The horizontal direction may indicate at least one of the first direction DR1 and the second direction DR2.

As shown in FIG. 1, the display device 10 may include a display module 10B that includes a display panel 100, an optical layer 110, a supporting film 400 (or film), and a frame 120, and a back cover 130 in rear of the display module 10B.

The embodiment describes an example where the display module 10B includes the display panel 100, the optical layer 110, the supporting film 400, and the frame 120. However, the configuration of the display module 10B may be variously changed. For example, the display module 10B may include the display panel 100, the optical layer 110, and the frame 120, and then the supporting film 400 may be attached to a front surface of the display module 10B.

The display panel 100 displaying an image may include a front substrate 101 (or first substrate) and a back substrate 111 (or second substrate), which are positioned opposite each other.

The optical layer 110 may be provided between the display panel 100 and the back cover 130.

The optical layer 110 may include a plurality of sheets. For example, the optical layer 110 may include at least one of a prism sheet and a diffusion sheet.

The frame 120 may be provided in rear of the optical layer 110.

A driving board for driving the display panel 100 may be provided on the frame 120.

The frame 120 may contain a metal material, for example, aluminum.

A light source unit that includes at least one light source may be provided on the frame 120.

The back cover 130 may be provided in rear of the frame 120.

The back cover 130 may be connected to the frame 120.

Figure 2:
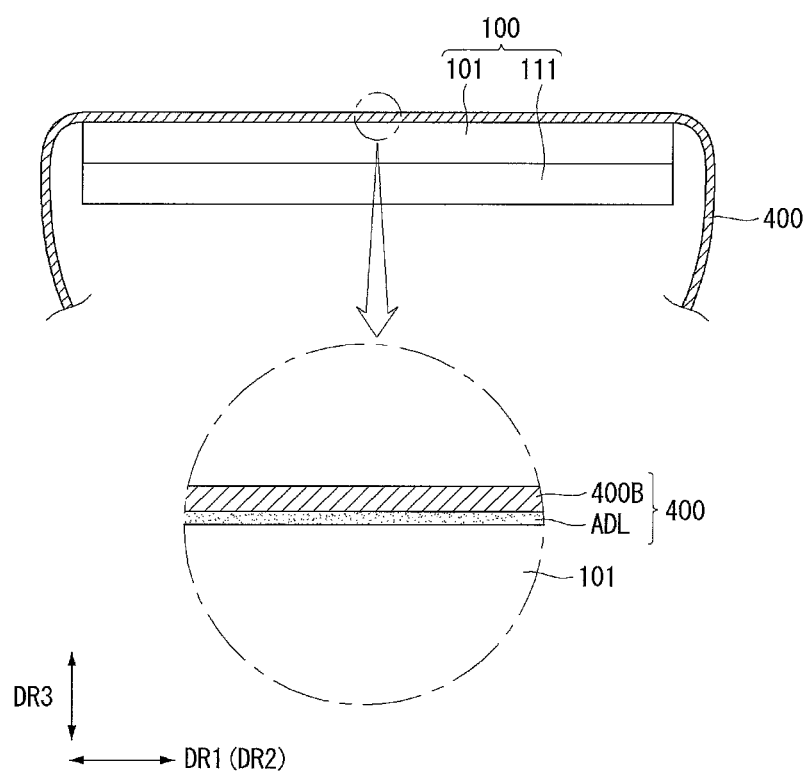

As shown in FIG. 2, the display panel 100 may include the front substrate 101 and the back substrate 111, which are positioned opposite each other and are attached to each other to form a uniform cell gap therebetween. A liquid crystal layer may be formed between the front substrate 101 and the back substrate 111.

A seal part may be formed between the front substrate 101 and the back substrate 111 to seal (or attach) the liquid crystal layer.

A color filter may be provided on the front substrate 101 to implement red, green, and blue colors.

The color filter may include a plurality of pixels each including red, green, and blue subpixels. When light is incident on the color filter, the color filter may generate images corresponding to the red, green, or blue color.

The pixels may include the red, green, and blue subpixels, but are not limited thereto. For example, red, green, blue, and white subpixels may configure one pixel, and various combinations of the subpixels may be used.

A predetermined transistor, for example, a thin film transistor (TFT) may be formed on the back substrate 111. The transistor may turn on or off liquid crystals in each pixel. In this example, the front substrate 101 may be referred to as a color filter substrate, and the back substrate 111 may be referred to as a TFT substrate.

The liquid crystal layer may include a plurality of liquid crystal molecules, and arrangement of the liquid crystal molecules may change in response to a driving signal supplied by the transistor. Light provided by the light source unit may be incident on the color filter based on changes in the arrangement of the liquid crystal molecules of the liquid crystal layer.

As a result, the color filter may implement red, green, and blue light, and thus a predetermined image may be displayed on the front substrate 101 of the display panel 100.

Since the above-described structure and configuration of the display panel 100 are merely an example, components may be changed, added, or omitted.

For example, the color filter for implementing red, green, and blue colors may be positioned on the back substrate 111, and the TFT may be formed on the front substrate 101. In this example, the back substrate 111 may be referred to as the color filter substrate, and the front substrate 101 may be referred to as the TFT substrate.

As shown in FIG. 2, the supporting film 400 may be attached to a front surface of the display panel 100. The supporting film 400 may include a film layer 400B and an adhesive layer ADL formed on the film layer 400B. The supporting film 400 may be attached to the front substrate 101 of the display panel 100 using the adhesive layer ADL.

The supporting film 400 may cover (or be provided at) the side of the display module 10B. This may be described in detail below.

Although not shown, the supporting film 400 may be connected to the frame 120.

The supporting film 400 may include a first part 410 attached to a front surface of the front substrate 101.

A partial area of the first part 410 of the supporting film 400 may transmit light. For example, as shown in (A) of FIG. 3, the first part 410 of the supporting film 400 may include a transparent portion 400TS and an opaque portion 400BL.

The opaque portion 400BL may be provided (or positioned) at an edge of the transparent portion 400TS, and a light transmittance of the transparent portion 400TS may be greater than a light transmittance of the opaque portion 400BL. The opaque portion 400BL may have a shape surrounding the transparent portion 400TS.

The opaque portion 400BL may block light provided by the light source unit from leaking into an area other than a display area.

Figure 3:
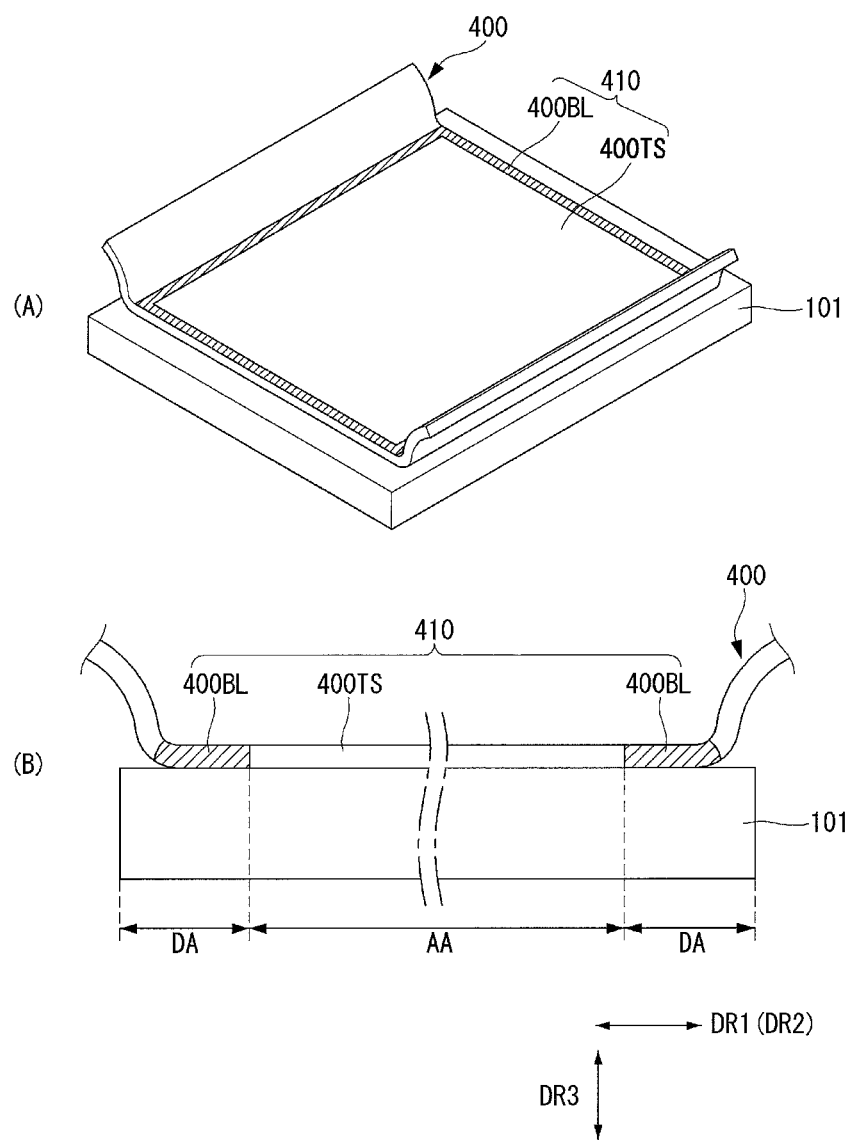

As shown in (B) of FIG. 3, the transparent portion 400TS of the first part 410 (of the supporting film 400) may correspond to an active area AA of the display panel 100, on which an image is displayed. The opaque portion 400BL of the first part 410 (of the supporting film 400) may correspond to a dummy area DA outside the active area AA of the display panel 100.

The opaque portion 400BL of the supporting film 400 may be darker than the transparent portion 400TS so as to reduce reflection of light. For example, the opaque portion 400BL of the supporting film 400 may be almost black. The opaque portion 400BL may include a dye.

Figure 4:
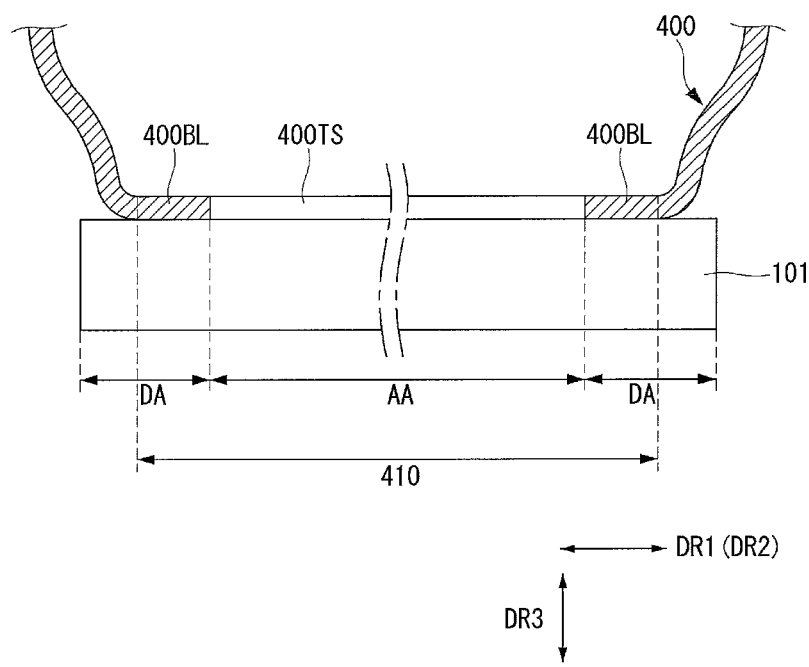

As shown in (B) of FIG. 3, a portion of the supporting film 400 corresponding to the dummy area DA (of the display panel 100) may include a dye. Alternatively, as shown in FIG. 4, portions other than a portion of the supporting film 400 corresponding to the active area AA (of the display panel 100) may include the dye. In this example, portions other than the first part 410 (of the supporting film 400) may include the dye.

The opaque portion 400BL may be formed through methods other than the method for forming the opaque portion 400BL of the supporting film 400 using the dye as described above.

Figure 5:
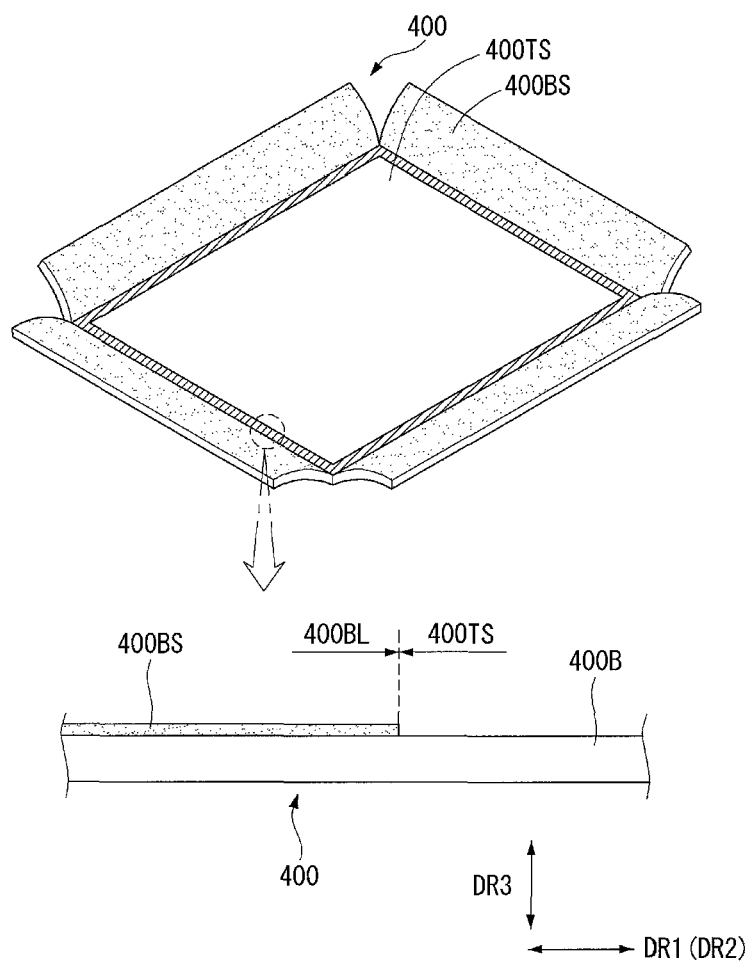

For example, as shown in FIG. 5, a black paint may be applied to a predetermined portion of the supporting film 400 to form the opaque portion 400BL.

Alternatively, a black sheet may be attached to a predetermined portion of the supporting film 400 to form the opaque portion 400BL.

Figure 6:
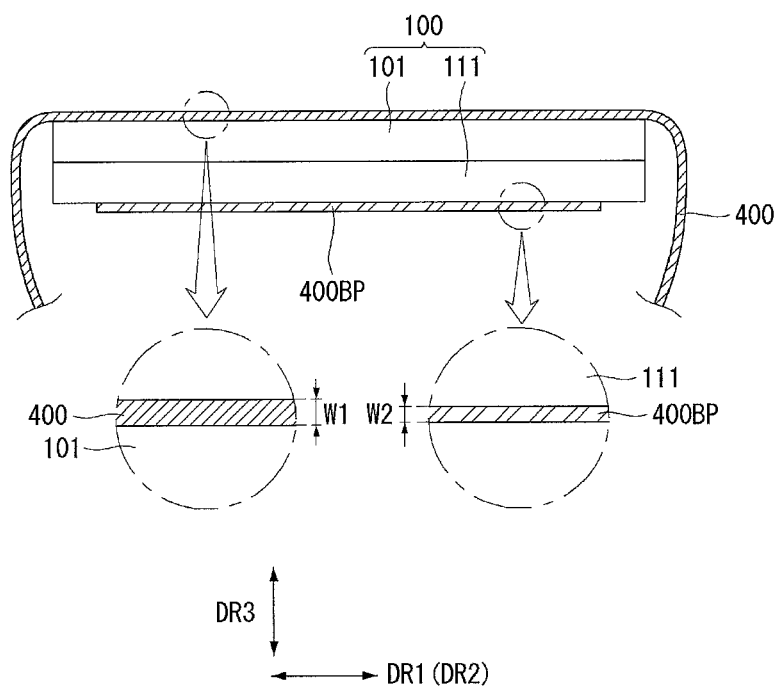

As shown in FIG. 6, a polarizing film 400BP may be provided (or attached) to a back surface of the back substrate 111. The polarizing film 400BP attached to the back surface of the back substrate 111 may be referred to as a back polarizing film 400BP.

The supporting film 400 attached to the front surface of the front substrate 101 may be a polarizing film. The supporting film 400 may be referred to as a front polarizing film.

The supporting film 400 may be thick enough to support the optical layer 110, etc. A thickness W1 of the supporting film 400 may be greater than a thickness W2 of the back polarizing film 400BP.

The total area of the supporting film 400 may be greater than the total area of the back polarizing film 400BP.

The back polarizing film 400BP may cover (or be provided on) a portion of the back surface of the back substrate 111, and the supporting film 400 may cover (or be provided on) the entire front surface of the front substrate 101.

A predetermined structure may be disposed in rear of the display panel 100. The structure may support the supporting film 400 at the side of the display module 10B. The structure supporting the supporting film 400 may be connected to the frame 120.

Figure 7:
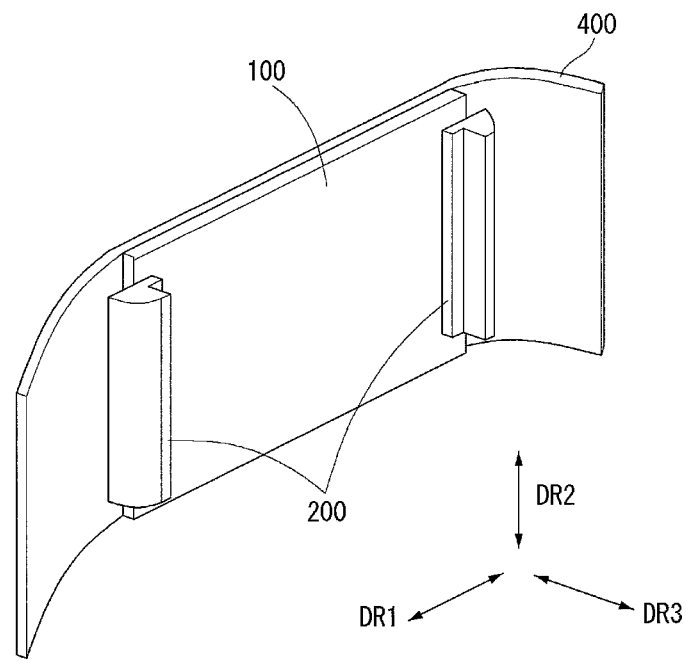

For example, as shown in FIG. 7, a bracket 200 may be provided (or disposed) on a back surface of the display panel 100 (i.e., on the back surface of the back substrate 111). The bracket 200 may support the supporting film 400 at the side of the display module 10B (or display panel).

The bracket 200 may be attached to the back surface of the back substrate 111.

Figure 8:
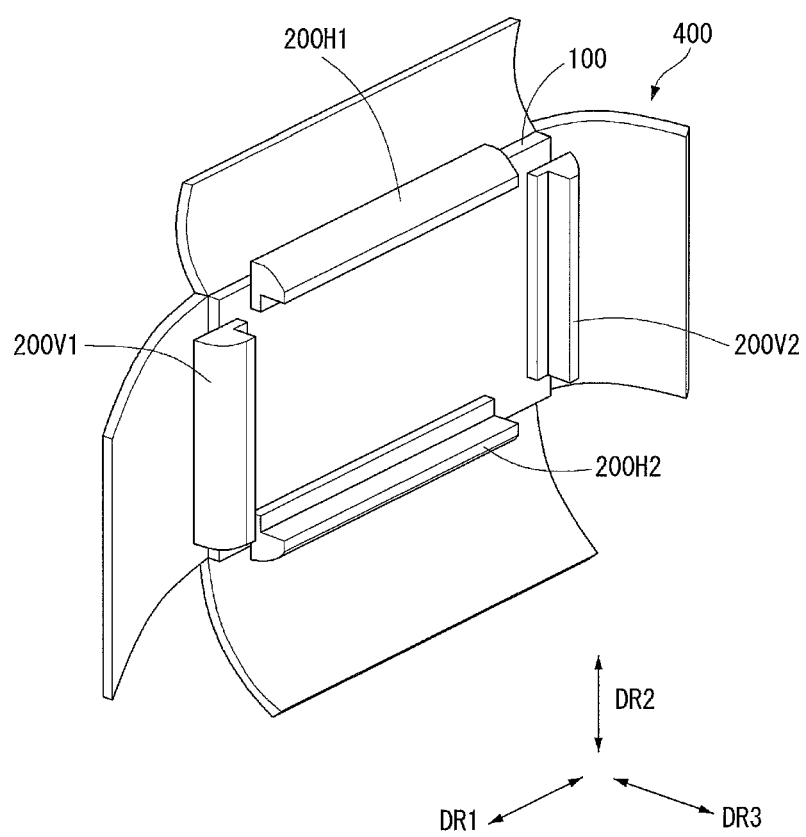

As shown in FIG. 8, the bracket 200 may be disposed on long sides as well as short sides of the display panel 100.

The disposition and the number of brackets 200 are not limited to the embodiments of FIGS. 7 and 8.

Figure 9:
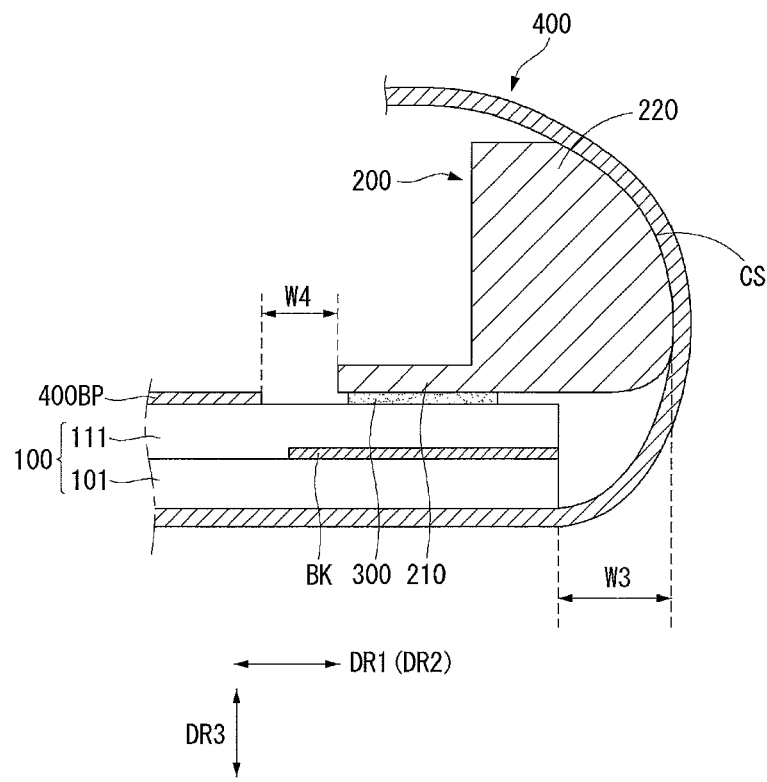

As shown in FIG. 9, an adhesive layer 300 may be provided (or disposed) between the back substrate 111 and the bracket 200. The adhesive layer 300 between the back substrate 111 and the bracket 200 may be referred to as a first adhesive layer.

The display panel 100 may further include a black layer BK between the front substrate 101 and the back substrate 111.

The bracket 200 may overlap the black layer BK.

The bracket 200 may include a protruding portion that protrudes further than the display panel 100 by a predetermined distance W3 in the horizontal direction (i.e., the first direction DR1 or the second direction DR2). The protruding portion of the bracket 200 may include a curved surface CS.

In this example, even when the supporting film 400 has sufficiently large rigidity, the supporting film 400 may easily cover (or be provided on) the curved surface CS of the bracket 200 while preventing damage to the supporting film 400.

The supporting film 400 may cover (or be provided on) the curved surface CS of the bracket 200.

The supporting film 400 may include a bending portion that covers the side of the bracket 200.

The bracket 200 and the back polarizing film 400BP may be separated from each other by a predetermined distance W4 in the horizontal direction (i.e., the first direction DR1 or the second direction DR2).

The bracket 200 may include a horizontal part 210 extending in the horizontal direction (i.e., the first direction DR1 or the second direction DR2) and a vertical part 220 extending from the horizontal part 210 in the vertical direction (i.e., the third direction DR3).

The vertical part 220 of the bracket 200 may have a curved surface CS.

Figure 10:
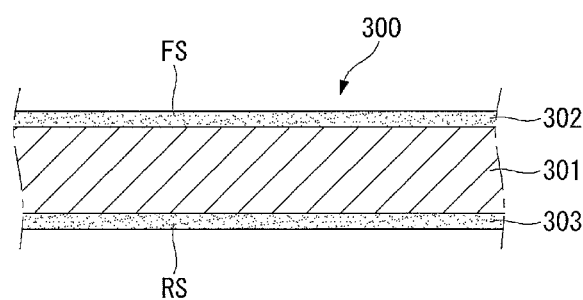

As shown in FIG. 10, the adhesive layer 300 attaching the bracket 200 to the back surface of the display panel 100 may include a base layer 301, a first layer 302, which is formed on a first surface FS of the base layer 301 and has the adhesion, and a second layer 303, which is formed on a second surface RS of the base layer 301 and has the adhesion.

The base layer 301 may be formed of a material with elasticity. For example, the base layer 301 may be formed of urethane foam.

The adhesive layer 300 having the above-described configuration may have elasticity and flexibility as well as adhesion. The adhesive layer 300 may prevent an external force from being applied to the bracket 200 and thus may prevent external force from being transferred to the display panel 100.

The adhesive layer 300 having the above-described configuration may be referred to as a foam pad.

When the bracket 200 is attached to the back surface of the display panel 100 using the foam pad type adhesive layer 300, the adhesive layer 300 may sufficiently have elasticity.

Figure 11:
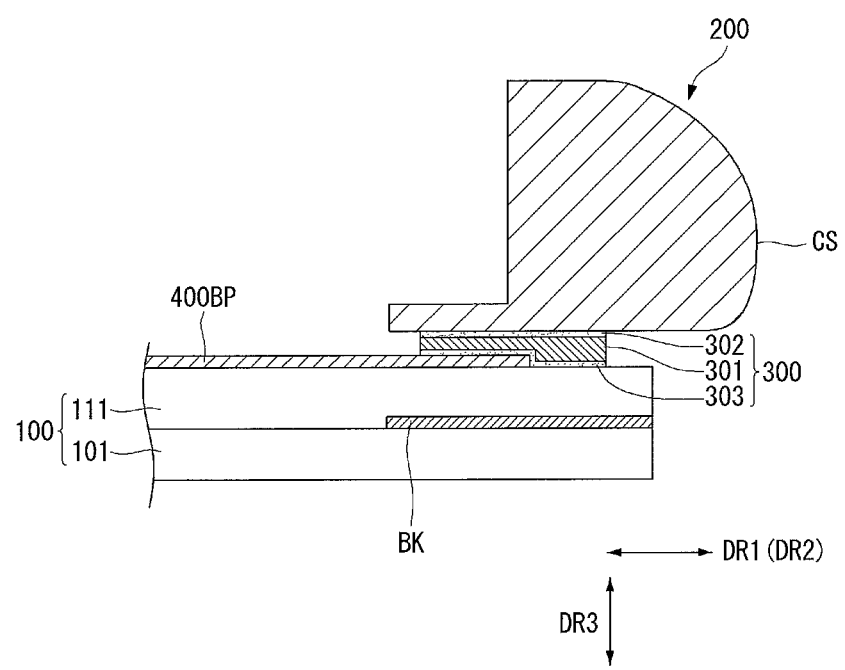

As shown in FIG. 11, the adhesive layer 300 may overlap the back polarizing film 400BP in the vertical direction (i.e., the third direction DR3).

Figure 12:
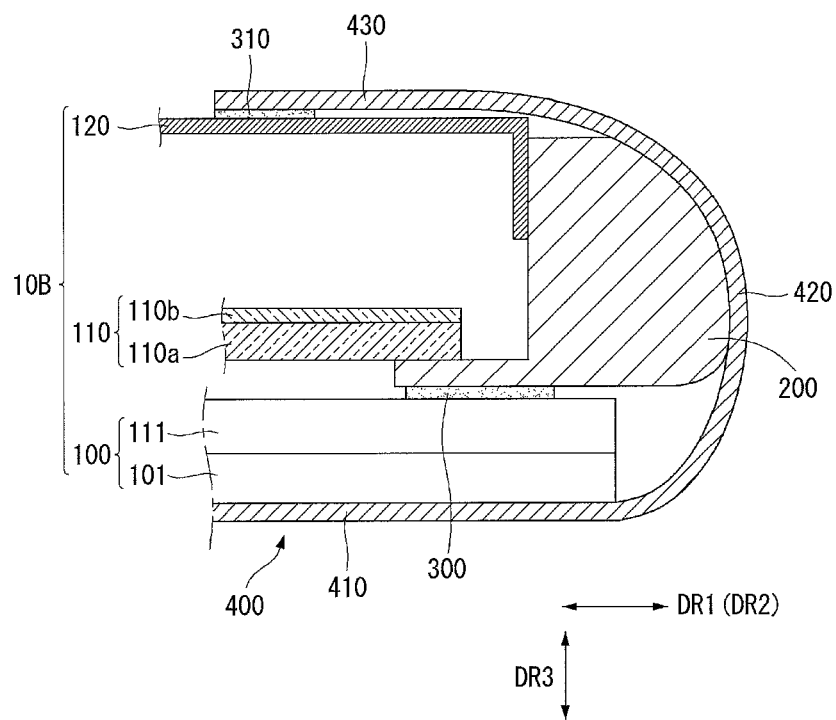

As shown in FIG. 12, the optical layer 110 included in a backlight unit may be provided (or disposed) between the back cover 130 and the display panel 100.

The optical layer 110 may include a plurality of sheets. For example, the optical layer 110 may include a prism sheet 110b and a diffusion sheet 110a.

The optical layer 110 may be provided (or disposed) on the horizontal part 210 of the bracket 200. An air gap may be formed between the optical layer 110 and the display panel 100.

The frame 120 may be provided (or disposed) in rear of the optical layer 110.

The frame 120 may be connected to the bracket 200. For example, the frame 120 may be connected to the vertical part 220 of the bracket 200.

The light source unit including at least one light source may be provided (or disposed) on the frame 120.

The light source unit may include various kinds of light sources. For example, the light sources of the light source unit may be one of a light emitting diode (LED) chip and a LED package having at least one LED chip. The light source may be a colored LED emitting at least one of red, green, and blue light or a white LED.

The light source unit may be one of a direct type backlight unit and an edge type backlight unit.

The supporting film 400 may cover the side of the bracket 200 and may extend to the frame 120. The supporting film 400 may be connected to the frame 120.

The supporting film 400 may be attached to the frame 120. For example, another adhesive layer 310, for example, a second adhesive layer 310 may be provided (or disposed) between the supporting film 400 and the frame 120.

As described above, the supporting film 400 attached to the front surface of the display panel 100 may extend to the rear of the display module 10B and may be attached to the frame 120. In such a configuration of the supporting film 400, the supporting film 400 may cover (or be provided at) the front surface and the side of the display module 10B.

The supporting film 400 may include the first part 410 covering the front surface of the front substrate 101 and a second part 420 that extends from the first part 410 and that covers (or is provided on) the side of the display module 10B.

The supporting film 400 may further include a third part 430 that extends from the second part 420 and that covers (or is provided on) a portion of the rear of the display module 10B.

The supporting film 400 may surround the display module 10B.

In the embodiment, the second part 420 and/or the third part 430 may include a black portion.

The black portion of the supporting film 400 was described above with reference to FIGS. 3 to 5.

Figure 13:
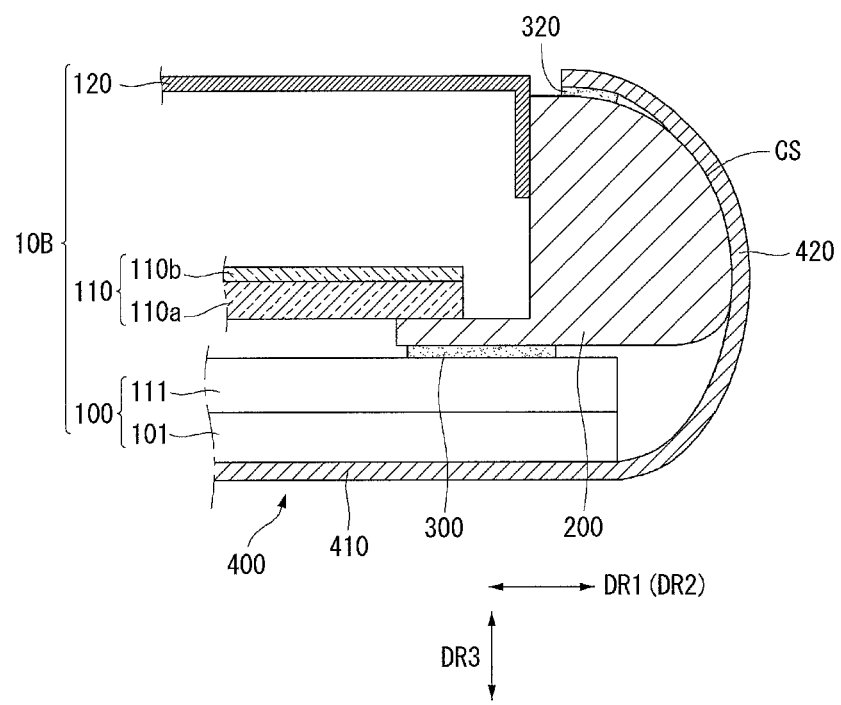

As shown in FIG. 13, the supporting film 400 may be attached to (or provided to) the bracket 200. In this example, a third adhesive layer 320 may be provided (or disposed) between the supporting film 400 and the bracket 200.

Figure 14:
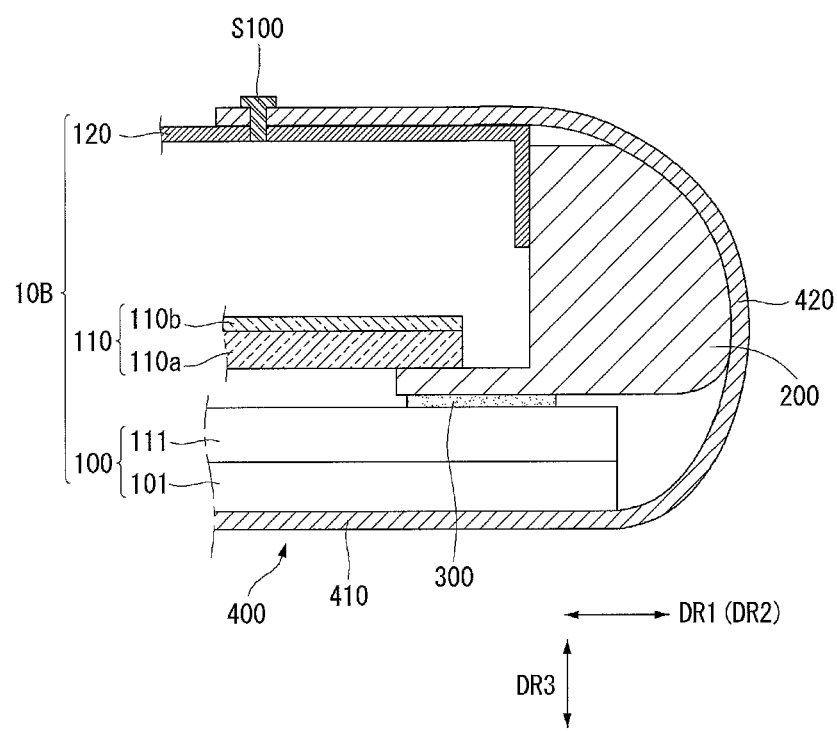

As shown in FIG. 14, the display device 10 may include a first fastening member S100, such as a screw, for fastening the frame 120 to the supporting film 400. More specifically, the first fastening member S100 may fasten the frame 120 to the third part 430 of the supporting film 400.

The second part 420 of the supporting film 400 may not be attached to the protruding portion (i.e., the curved surface CS) of the bracket 200 for the convenience of manufacturing process.

Figure 15:
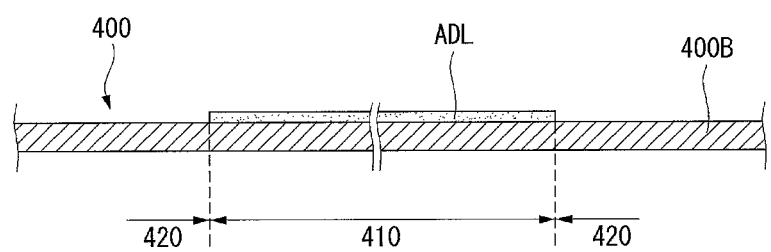

For this example, as shown in FIG. 15, the adhesive layer ADL may be formed in an area corresponding to the first part 410 (of the supporting film 400), but may be omitted in an area corresponding to the second part 420 (of the supporting film 400).

In this example, because the supporting film 400 is not attached to the bracket 200 in the manufacturing process, a process for connecting the supporting film 400 to the frame 120 may be easily performed.

Figure 16:
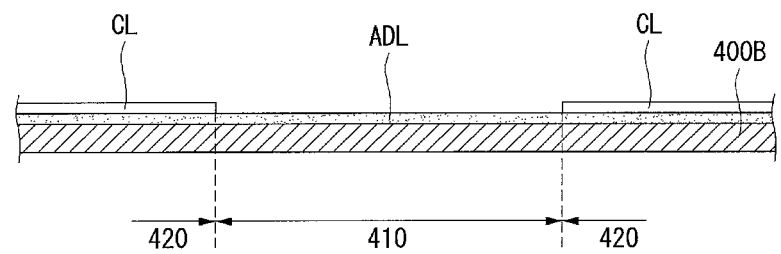

Alternatively, as shown in FIG. 16, the supporting film 400 may include a film layer 400B and the adhesive layer ADL and a cover layer CL, which are formed on the film layer 400B.

The cover layer CL may cover the adhesive layer ADL in the area corresponding to the second part 420 (of the supporting film 400). The cover layer CL may be omitted (or not provided) in the area corresponding to the first part 410 (of the supporting film 400).

The cover layer CL may be configured so that the second part 420 (of the supporting film 400) is not attached to the side of the bracket 200.

Figure 17:
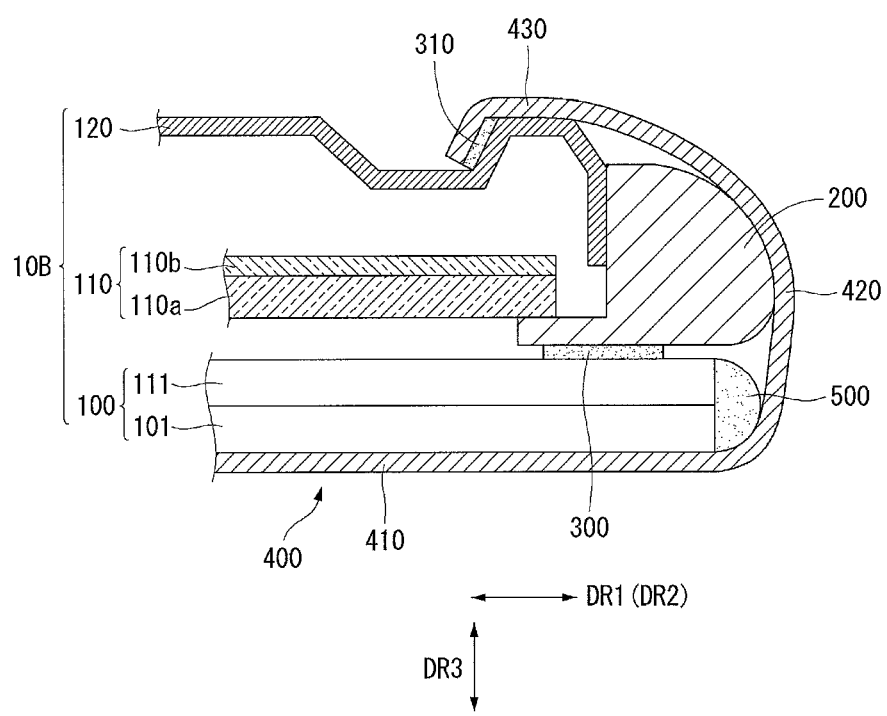

As shown in FIG. 17, a resin layer 500 may be formed on the side of the display panel 100 (i.e., the side of the front substrate 101 and/or the side of the back substrate 111).

The resin layer 500 may prevent the supporting film 400 from sharply bending at an end of the display panel 100.

The resin layer 500 may contain a resin material and a photosensitive material. In this example, time required in a formation process of the resin layer 500 may be reduced.

Figure 18:
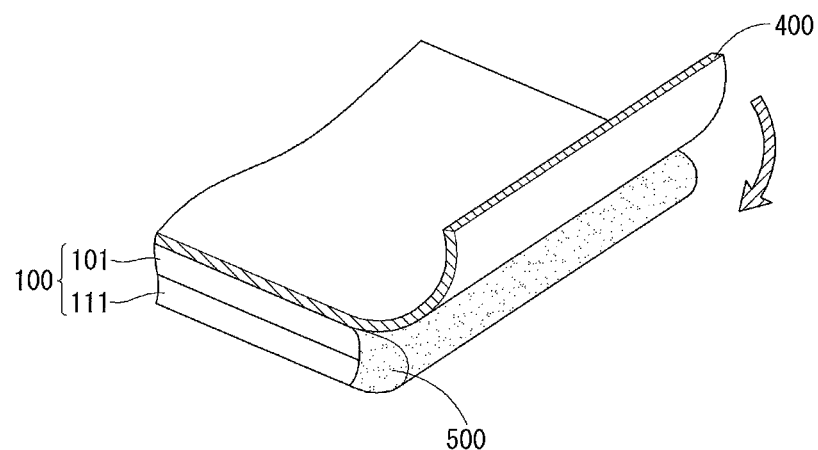

As shown in FIG. 18, in the formation process of the resin layer 500, the resin layer 500 may be formed on the side of the display panel 100 in a state where the supporting film 400 is attached to the front surface of the display panel 100.

Afterwards, the supporting film 400 may move in an arrow direction shown in FIG. 18 and may be the resin layer 500.

Figure 19:
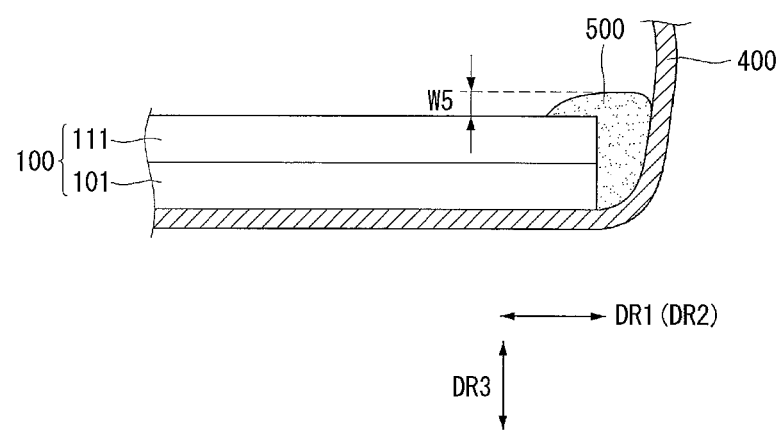

In this example, a pressure may be applied to the resin layer 500 by the supporting film 400. As shown in FIG. 19, the resin layer 500 may include a portion that protrudes further than the back surface of the back substrate 111 by a predetermined distance W5 in the vertical direction (i.e., the third direction DR3) by pressure applied to the resin layer 500.

Figure 20:
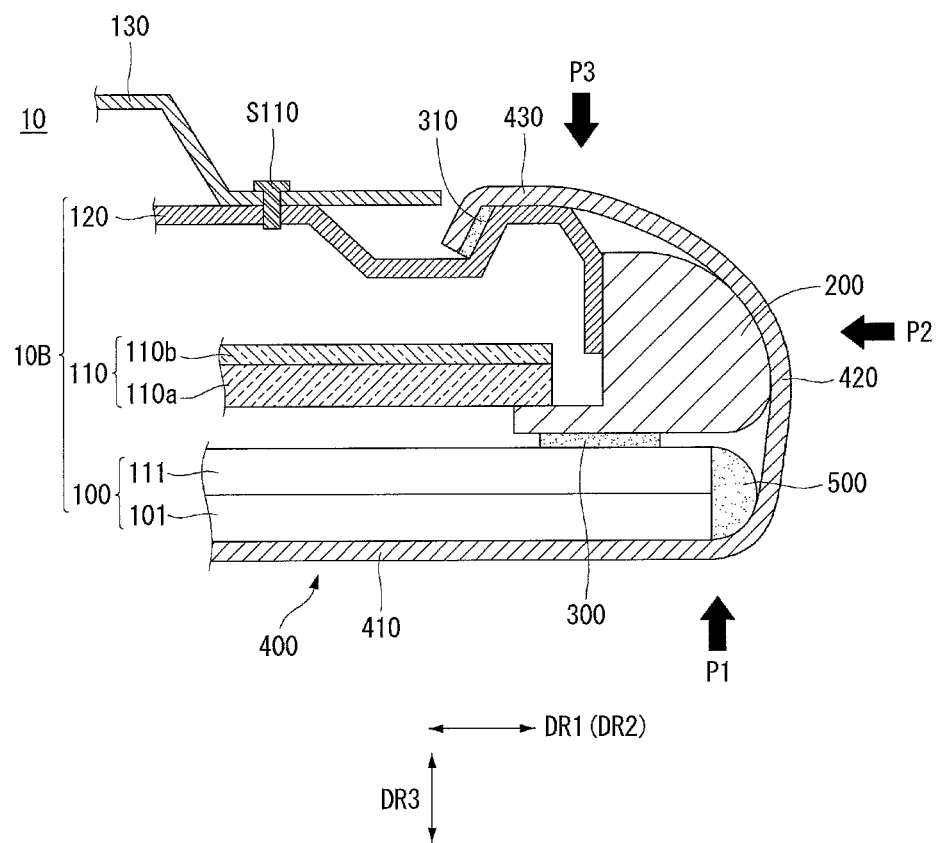

As shown in FIG. 20, the back cover 130 may be provided (or disposed) in the rear of the frame 120.

The back cover 130 may be connected to the frame 120. For example, a second fastening member S110 may fasten the back cover 130 to the frame 120.

At least a portion of each of the first part 410 and the second part 420 of the supporting film 400 may be exposed in a state in which the back cover 130 is connected to the frame 120. In at least one embodiment, all of the first part 410 may be exposed.

In this example, an observer at a first position P1 may observe at least a portion (or all) of the first part 410 of the supporting film 400. Further, the observer at a second position P2 may observe at least a portion of the second part 420 of the supporting film 400.

The observer may feel that the display device 10 is configured as one glass substrate.

Alternatively, the observer at a third position P3 may observe at least a portion of the third part 430 of the supporting film 400.

Figure 21:
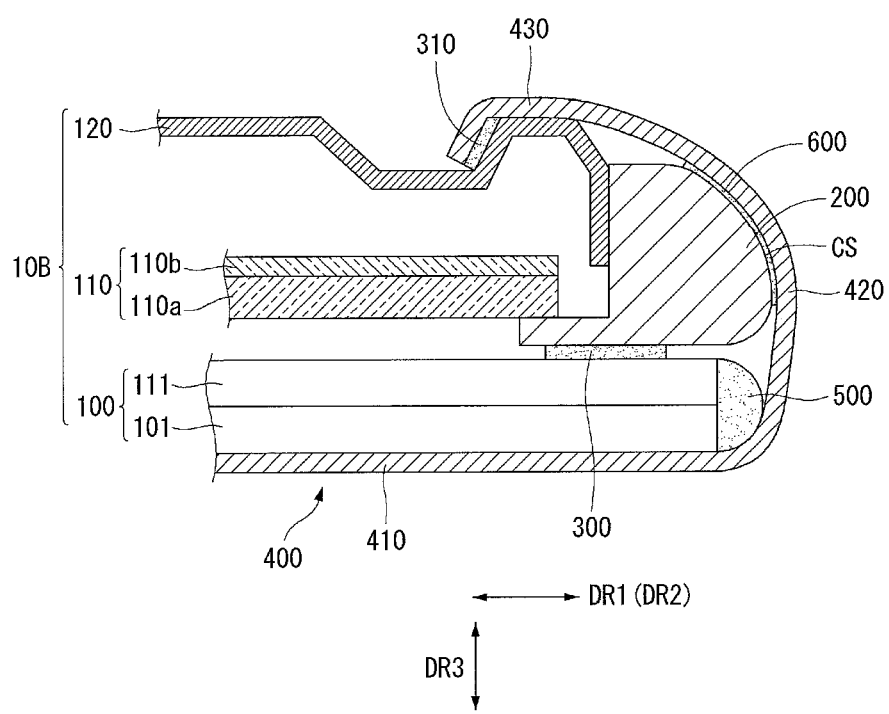

As shown in FIG. 21, a buffer 600 may be provided (or disposed) between the supporting film 400 and the bracket 200, so as to reduce a friction between the supporting film 400 and the bracket 200.

The buffer 600 may contain a material having elasticity and flexibility. For example, the buffer 600 may contain a sponge material.

Alternatively, the buffer 600 may be a tape attached to the bracket 200.

Figure 22:
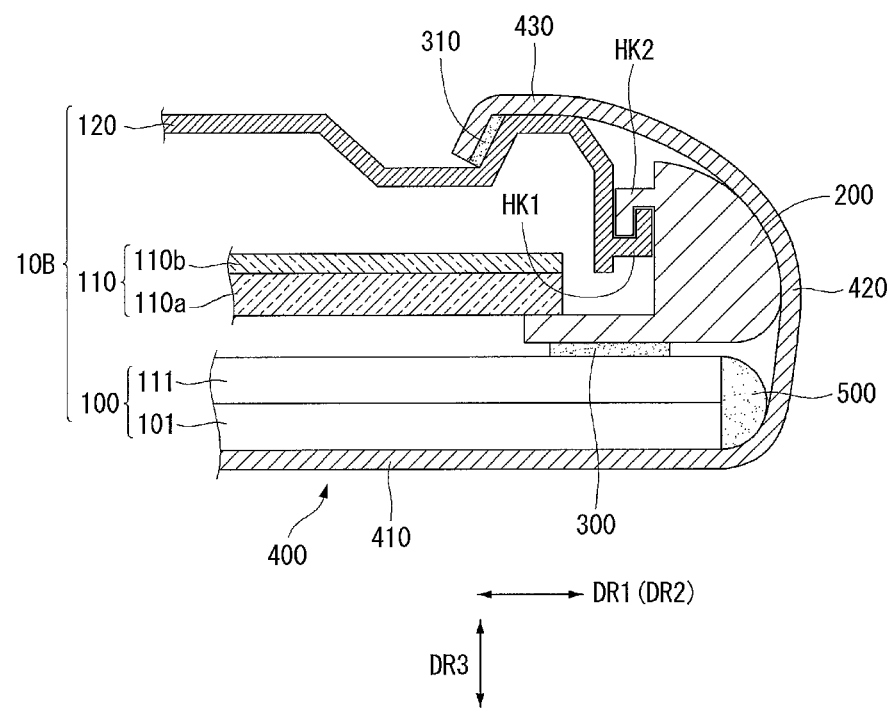

As shown in FIG. 22, the frame 120 may include a first hook HK1, and the bracket 200 may include a second hook HK2 corresponding to the first hook HK1.

As the first hook HK1 is engaged with the second hook HK2, the frame 120 may be connected to the bracket 200.

Figure 23:
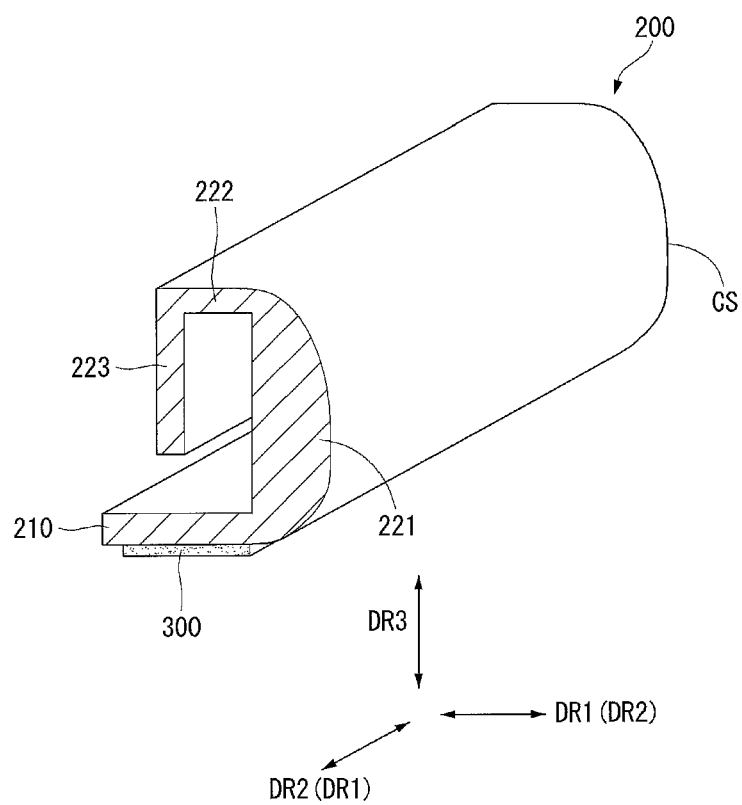

In the embodiment, the configuration of the bracket 200 is not limited to the configuration described above. For example, as shown in FIG. 23, the vertical part 220 of the bracket 200 may include a first vertical portion 221 extending from the horizontal part 210 in the vertical direction (i.e., the third direction DR3), a second vertical portion 222 extending from the first vertical portion 221 in the horizontal direction (i.e., the first direction DR1 or the second direction DR2) (toward a center of the display panel 100), and a third vertical portion 223 extending from the second vertical portion 222 in the vertical direction (i.e., the third direction DR3) (toward the horizontal part 210).

The first vertical portion 221 may include a curved surface CS.

Figure 24:
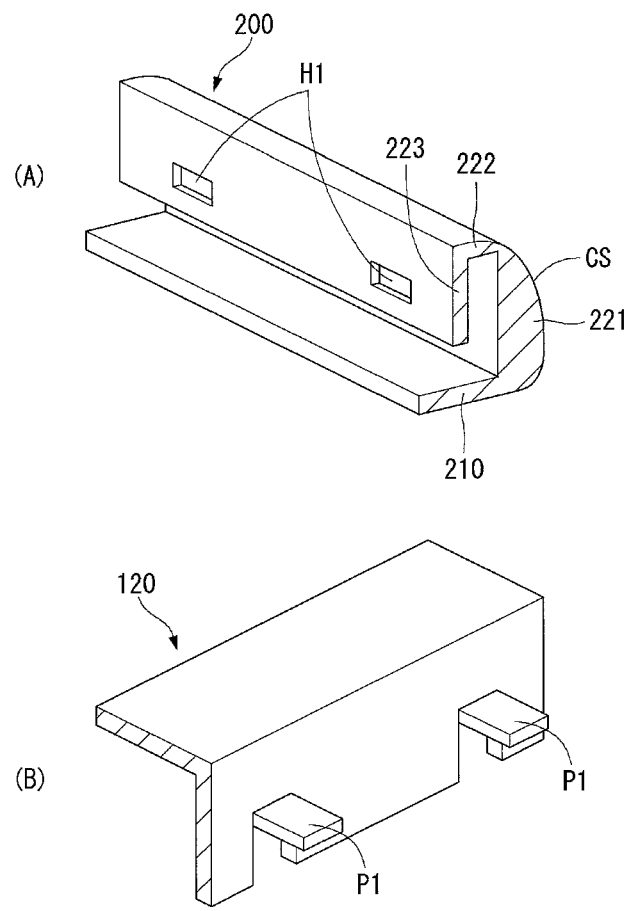

As shown in (A) of FIG. 24, the third vertical portion 223 of the bracket 200 may include a first opening H1.

As shown in (B) of FIG. 24, the frame 120 may include a protrusion P1 corresponding to the first opening H1.

Figure 25:
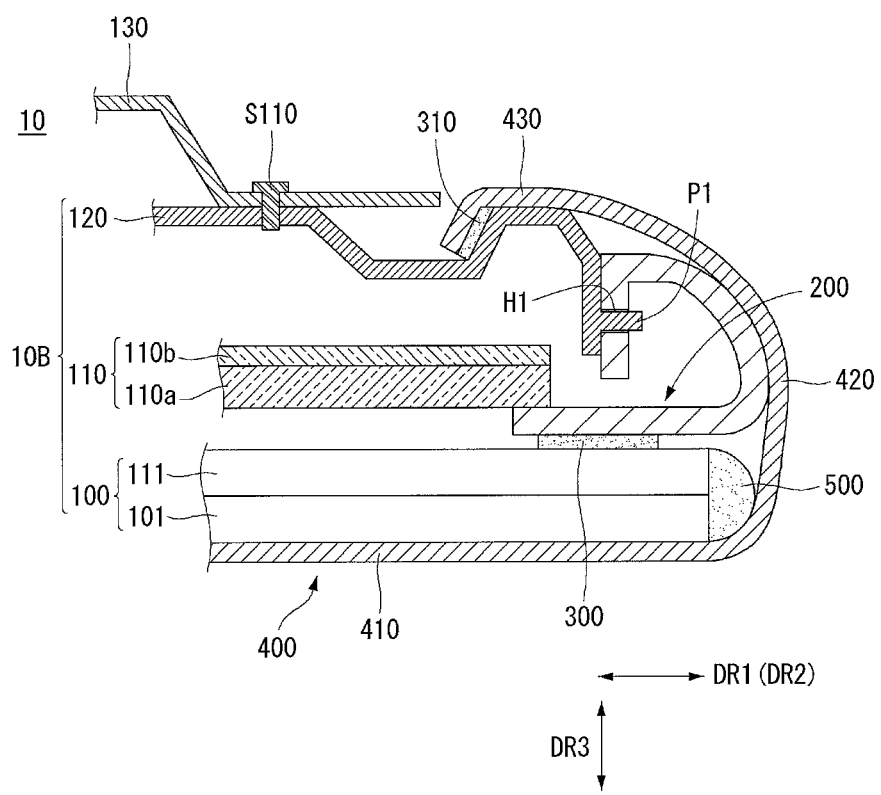

As shown in FIG. 25, as the protrusion P1 of the frame 120 is inserted into the first opening H1 of the bracket 200, the frame 120 may be connected to the bracket 200.

Figure 26:
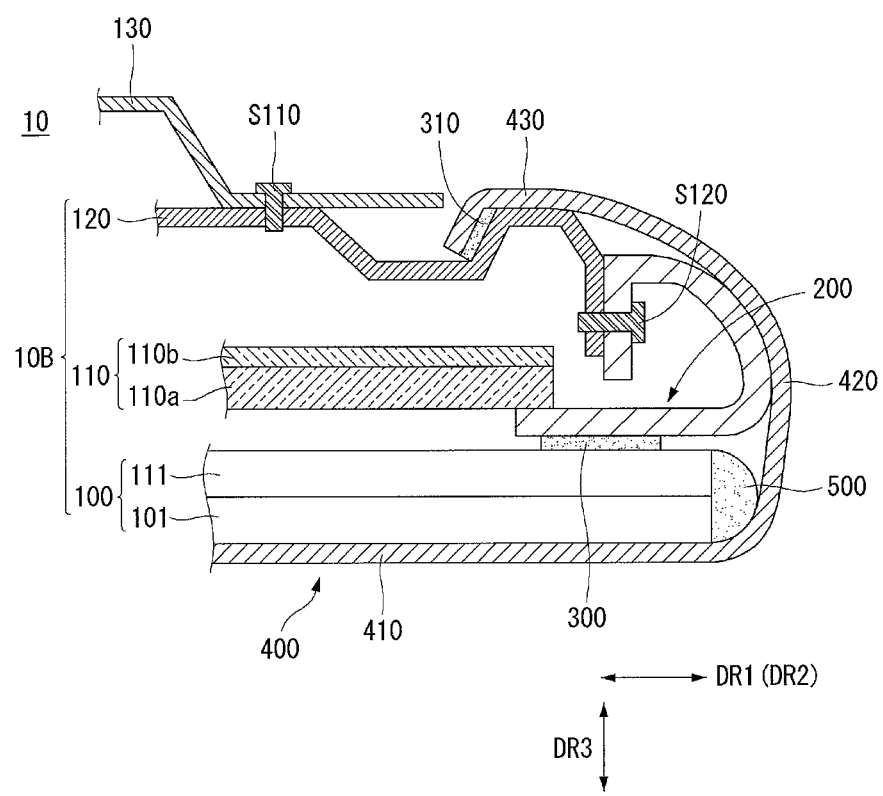

As shown in FIG. 26, a second fastening member S120 may fasten the bracket 200 to the frame 120.

Figure 27:
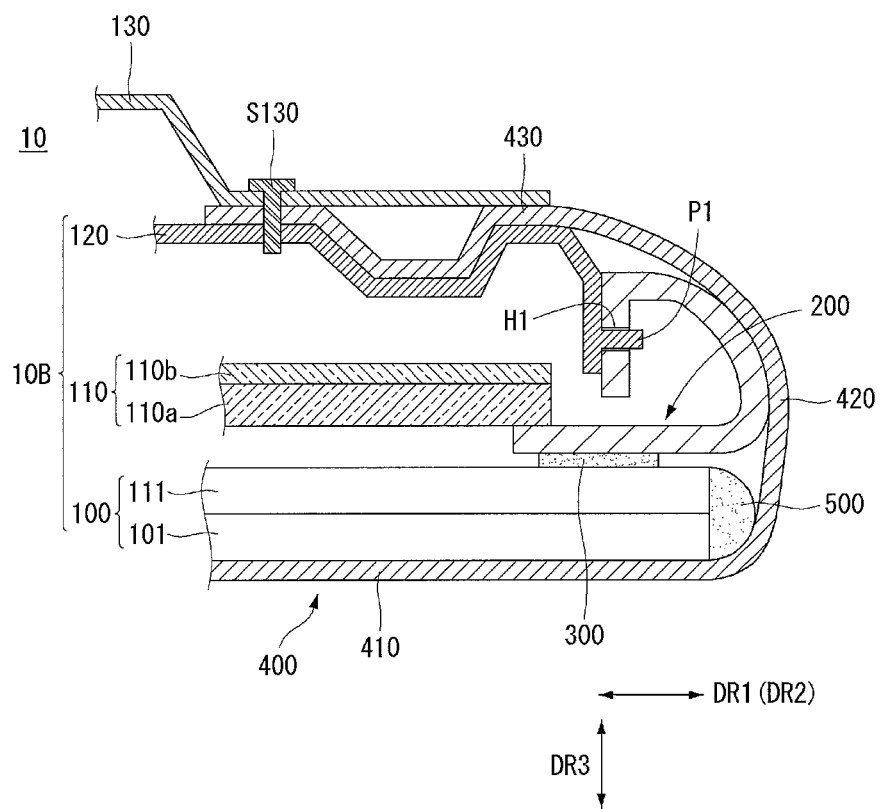

As shown in FIG. 27, the back cover 130 may cover a portion (e.g., a portion of the third part 430) of the supporting film 400.

In this example, a third fastening member S130 may fasten the back cover 130, the supporting film 400, and the frame 120 together.

The embodiment describes an example where the bracket 200 supports the supporting film 400 at the side of the display module 10B. However, another structure, as described below, may support the supporting film 400 at the side of the display module 10B. In the following description, the descriptions of configuration and structure described above may be omitted.

Figure 28:
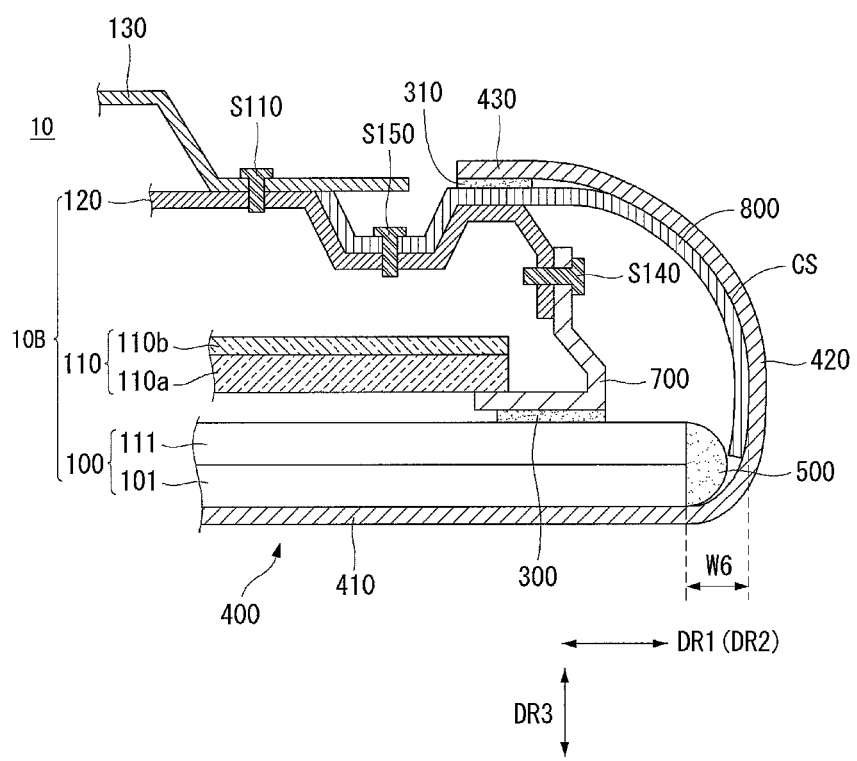

As shown in FIG. 28, a supporter 700 may be attached to the back surface of the display panel 100 by the adhesive layer 300. The supporter 700 may support the supporting film 400 at the side of the display module 10B.

The frame 120 and the supporter 700 may be fastened to each other by a fourth fastening member S140.

The display device 10 according to the example embodiment may further include a side cover 800.

The side cover 800 may cover the side of the display module 10B and may be connected to the frame 120. A fifth fastening member S150 may fasten the side cover 800 to the frame 120.

The side cover 800 may include a portion that protrudes further than the display panel 100 by a predetermined distance W6 in the horizontal direction (i.e., the first direction DR1 or the second direction DR2). The protruding portion of the side cover 800 may include a curved surface CS.

The supporting film 400 may cover the curved surface CS of the side cover 800.

The third part 430 of the supporting film 400 may be attached to the side cover 800. Alternatively, the supporting film 400 may be attached to the frame 120.

The side cover 800 may include a portion that covers the side of the display panel 100. More specifically, the side cover 800 may include a portion that covers the side of the front substrate 101 or the sides of the front substrate 101 and the back substrate 111.

As described above, when the side cover 800 is provided, a buffer 600 may be provided (or disposed) between the side cover 800 and the supporting film 400. The buffer 600 is described above with reference to FIG. 21.

As described above, a shape of the structure may be changed, and the supporting film 400 may cover the structure.

Figure 29:
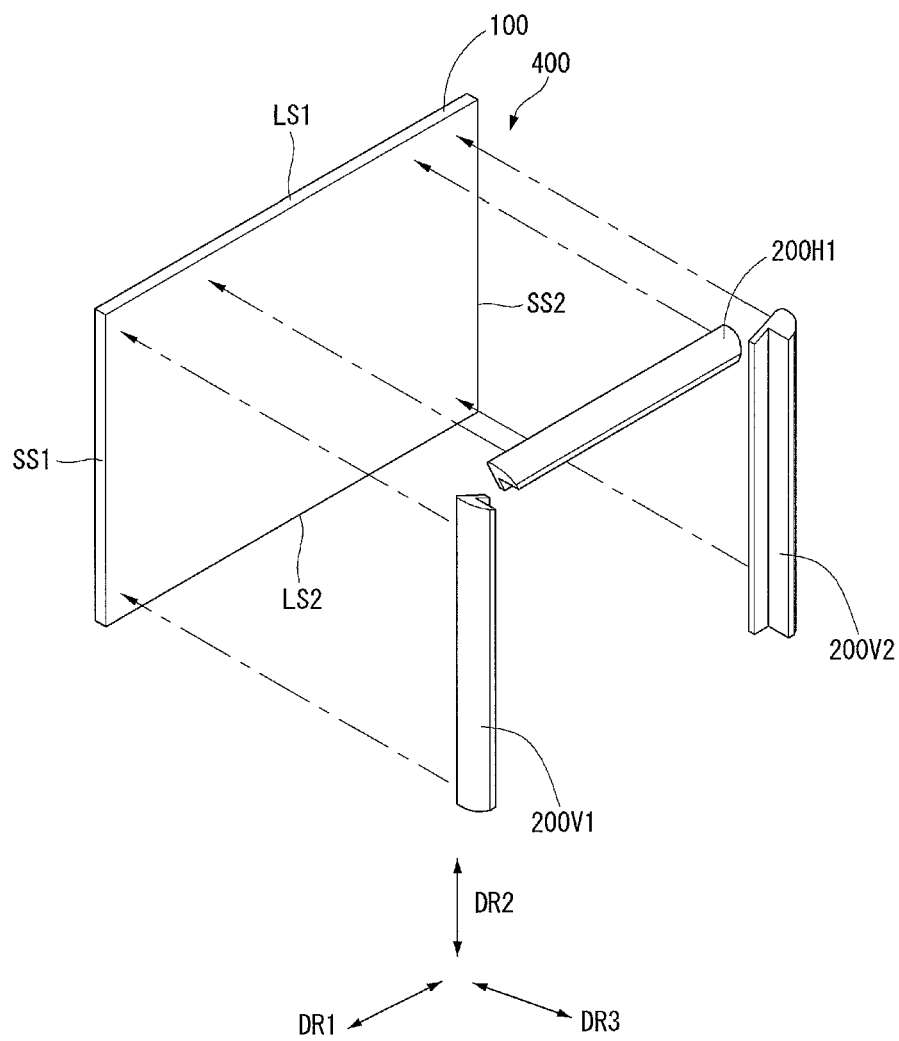

As shown in FIG. 29, the display panel 100 may include a first long side LS1 (or first side), a second long side LS2 (or second side) opposite the first long side LS1, a first short side SS1 (or third side) adjacent to the first long side LS1 and the second long side LS2, and a second short side SS2 (or fourth side) that is adjacent to the first long side LS1 and the second long side LS2 and is opposite to the first short side SS1.

The bracket 200 may include a first horizontal bracket 200H1 disposed on the first long side LS1 of the display panel 100, a first vertical bracket 200V1 disposed on the first short side SS1 of the display panel 100, and a second vertical bracket 200V2 disposed on the second short side SS2 of the display panel 100.

In this example, at least a portion of each of the first part 410 and the second part 420 of the supporting film 400 may be exposed to the first long side LS1, the first short side SS1, and the second short side SS2 of the display device 10.

Two adjacent ends of the bracket 200 may be opposite to each other on the corner of the display device 10 in an oblique direction.

Figure 30:
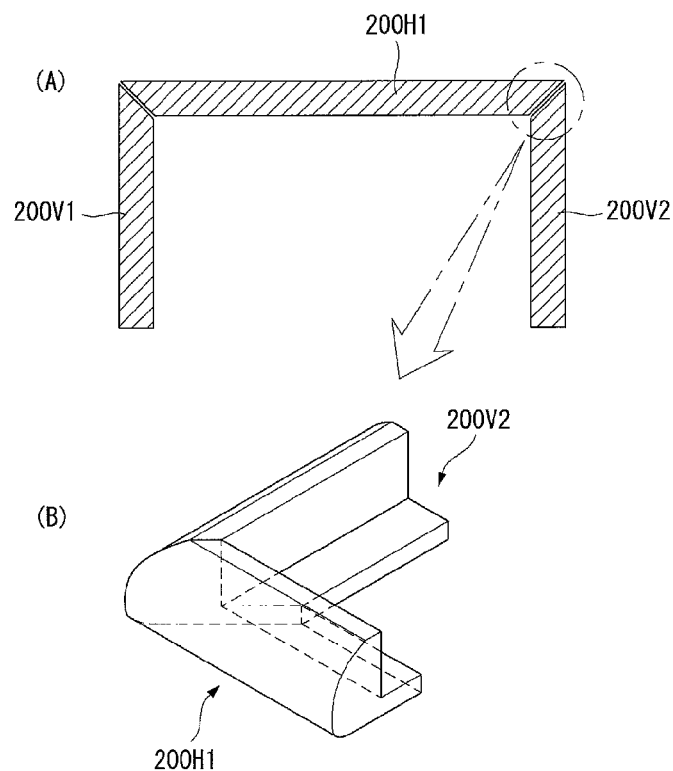
Figure 31:
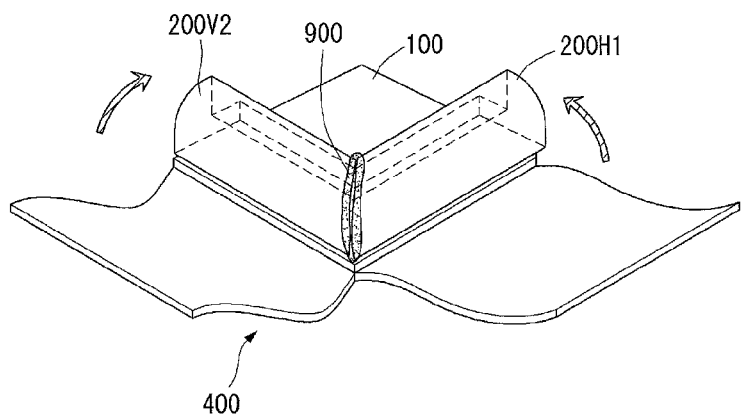

For example, as shown in (A) and (B) of FIG. 30 and FIG. 31, an end of the first horizontal bracket 200H1 and an end of the second vertical bracket 200V2 may be opposite to each other on the corner of the display device 10 in an oblique direction. In this example, the supporting film 400 may certainly cover the bracket 200 on the corner of the display device 10.

As shown in FIG. 31, the display device 10 may include a protective layer 900 that covers two adjacent ends of the bracket 200 that are opposite to each other on the corner of the display device 10 in the oblique direction.

The protective layer 900 may contain a resin material or a silicon material having adhesion and elasticity. Further, the protective layer 900 may contain a photosensitive material.

Figure 32:
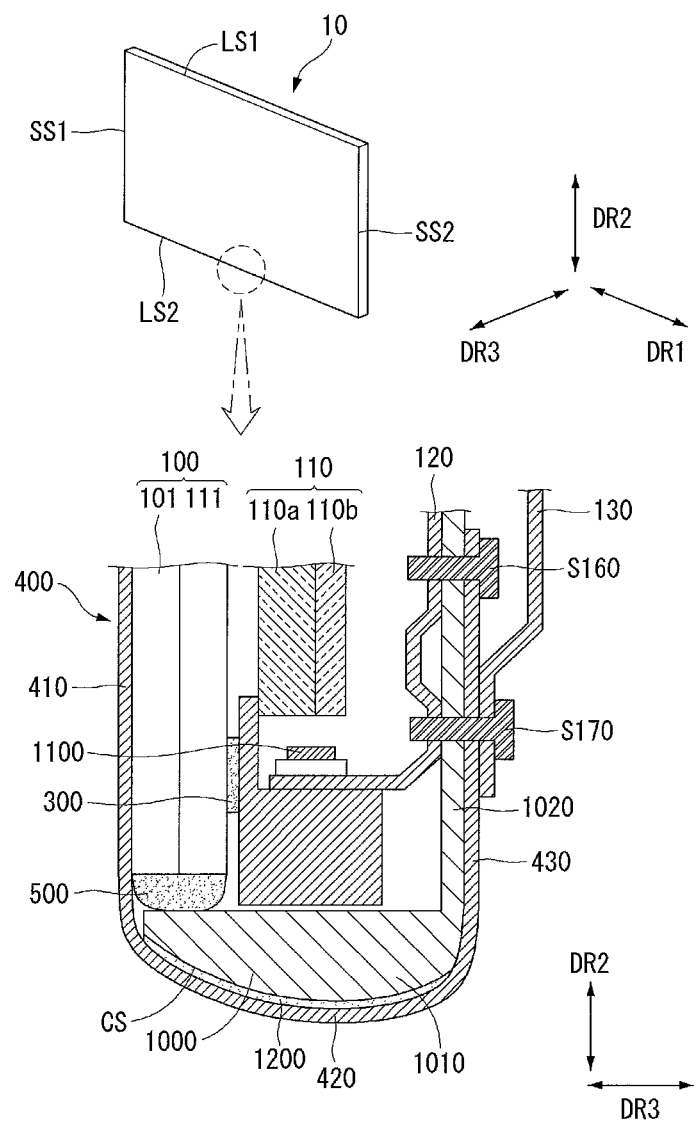

As shown in FIG. 32, the display device 10 according to the example embodiment may further include a bottom supporter 1000 disposed at the bottom of the display device 10. The bottom supporter 1000 may support the display module 10B on the second long side LS2 corresponding to the lower side of the display module 10B.

A lower bracket 900 may be attached to the back surface of the display panel 100 on the second long side LS2 corresponding to the lower side of the display device 10.

A shape of the lower bracket 900 may be different from the shape of the above-described bracket 200. Alternatively, the shape of the lower bracket 900 may be substantially the same as the shape of the bracket 200.

The bottom supporter 1000 may be connected to the frame 120. For example, a sixth fastening member S160 may fasten the bottom supporter 1000 to the frame 120.

Alternatively, the sixth fastening member S160 may fasten the third part 430 of the supporting film 400, the bottom supporter 1000, and the frame 120 together.

The bottom supporter 1000 may include a vertical bottom portion 1010 that extends in the vertical direction (i.e., the third direction DR3) and includes a portion positioned on the side of the display module 10B, and a horizontal bottom portion 1020 that extends from the vertical bottom portion 1010 in the second direction DR2 of the horizontal direction.

The horizontal bottom portion 1020 of the bottom supporter 1000 may be connected to the frame 120.

The vertical bottom portion 1010 of the bottom supporter 1000 may include a curved surface CS, and the supporting film 400 may cover the curved surface CS of the vertical bottom portion 1010.

Another buffer 1200 may be provided (or disposed) between the vertical bottom portion 1010 of the bottom supporter 1000 and the second part 320 of the supporting film 400. The buffer 1200 may contain the same material as the buffer 600 shown in FIG. 21.

A seventh fastening member S170 may fasten the back cover 130, the supporting film 400, the horizontal bottom portion 1020 of the bottom supporter 1000, and the frame 120 together. As described above, the bottom supporter 1000 may be connected to the frame 120 and the back cover 130.

As described above, the supporting film 400 at the bottom of the display device 10 may surround the side of the display module 10B.

In FIG. 32, a reference numeral 1100 may represent the light source.

Figure 33:
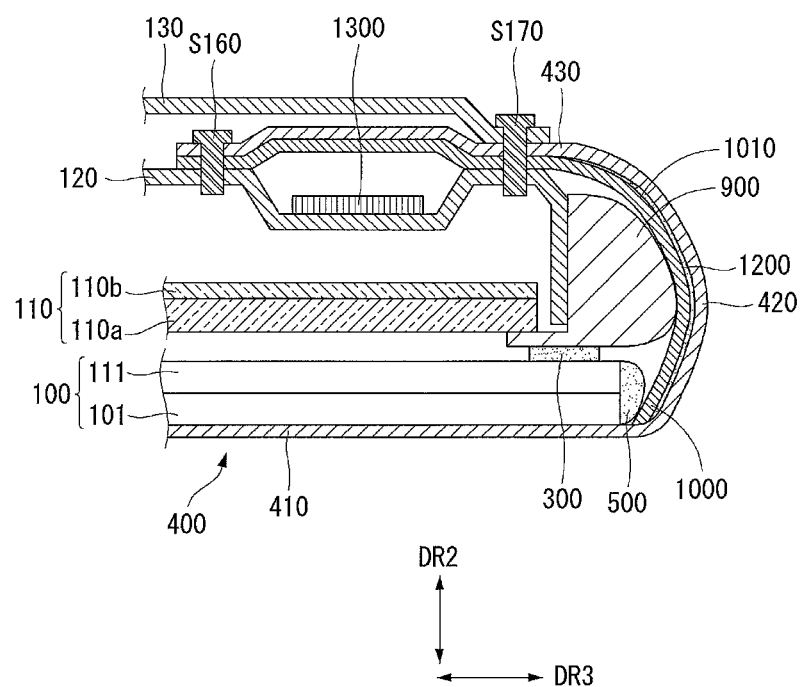

In the example embodiment, the configuration of the bottom supporter 1000 may be variously changed. For example, as shown in FIG. 33, the vertical bottom portion 1010 of the bottom supporter 1000 may convexly bend in a direction far from the display module 10B.

A driving board 1300 may be provided (or disposed) in the rear of the frame 120.

Further, the horizontal bottom portion 1020 of the bottom supporter 1000 may cover the driving board 1300. The driving board 1300 may be positioned between the frame 120 and the horizontal bottom portion 1020 of the bottom supporter 1000.

Figure 34:
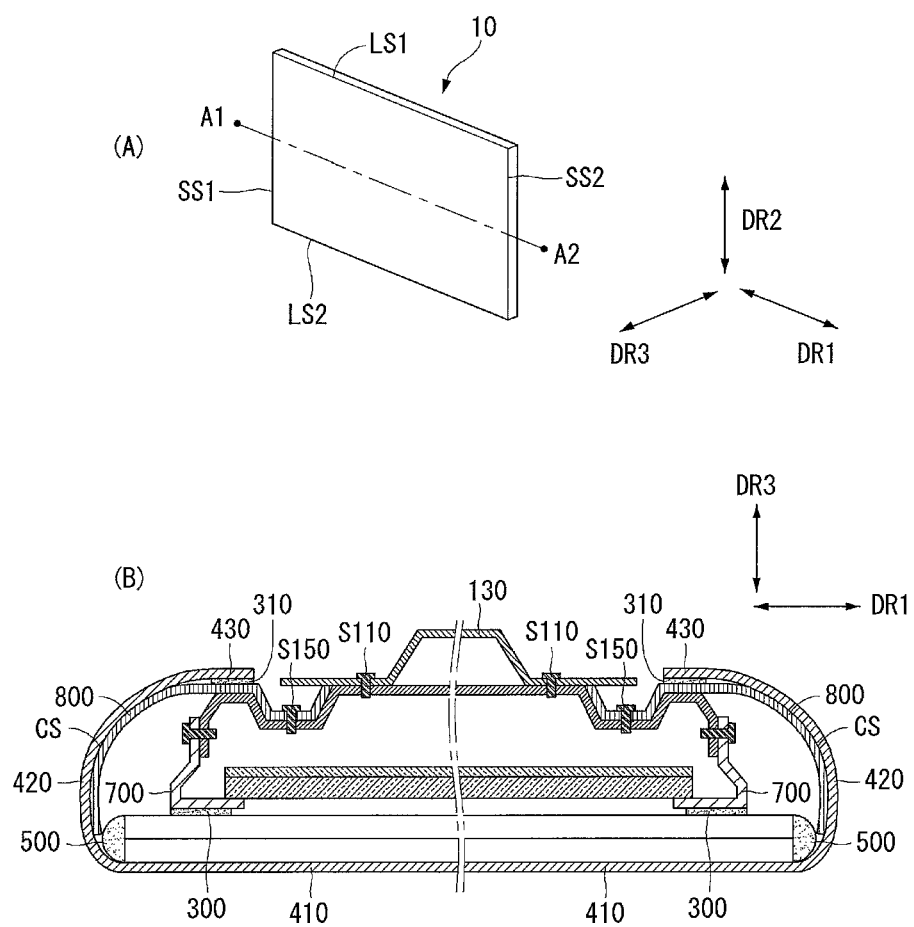

As shown in (B) of FIG. 34, which is a cross-sectional view of the display device 10 taken along line A1-A2 of (A) of FIG. 34, at least a portion of each of the first part 410 and the second part 420 of the supporting film 400 may be exposed to the first short side SS1 and the second short side SS2 (of the display device 10).

Figure 35:
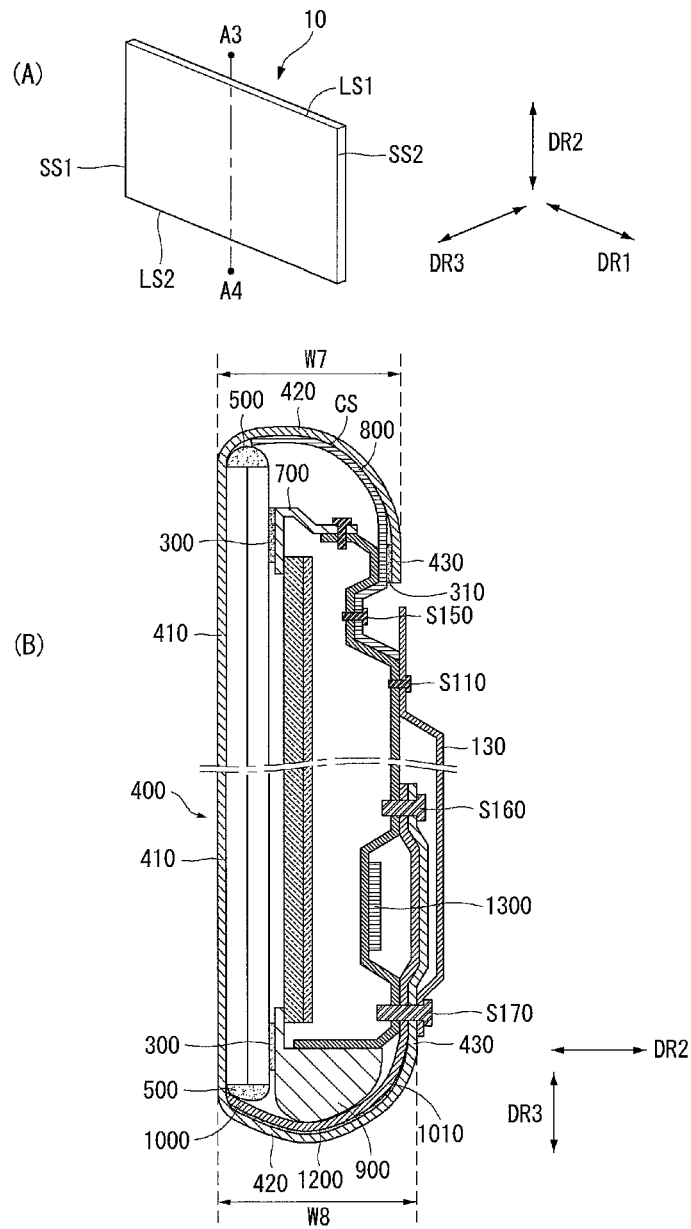

As shown in (B) of FIG. 35, which is a cross-sectional view of the display device 10 taken along line A3-A4 of (A) of FIG. 35, at least a portion of each of the first part 410 and the second part 420 of the supporting film 400 may be exposed to the first long side LS1 and the second long side LS2 (of the display device 10).

The whole of the first part 410 of the supporting film 400 may be substantially exposed.

Because the driving board 1300 is disposed in a lower area of the display device 10, a width W8 of the second part 420 of the supporting film 400 in the vertical direction (i.e., the third direction DR3) at the second long side LS2 of the display device 10 may be greater than a width W7 of the second part 420 of the supporting film 400 in the vertical direction (i.e., the third direction DR3) at the first long side LS1 of the display device 10.

Figure 36:
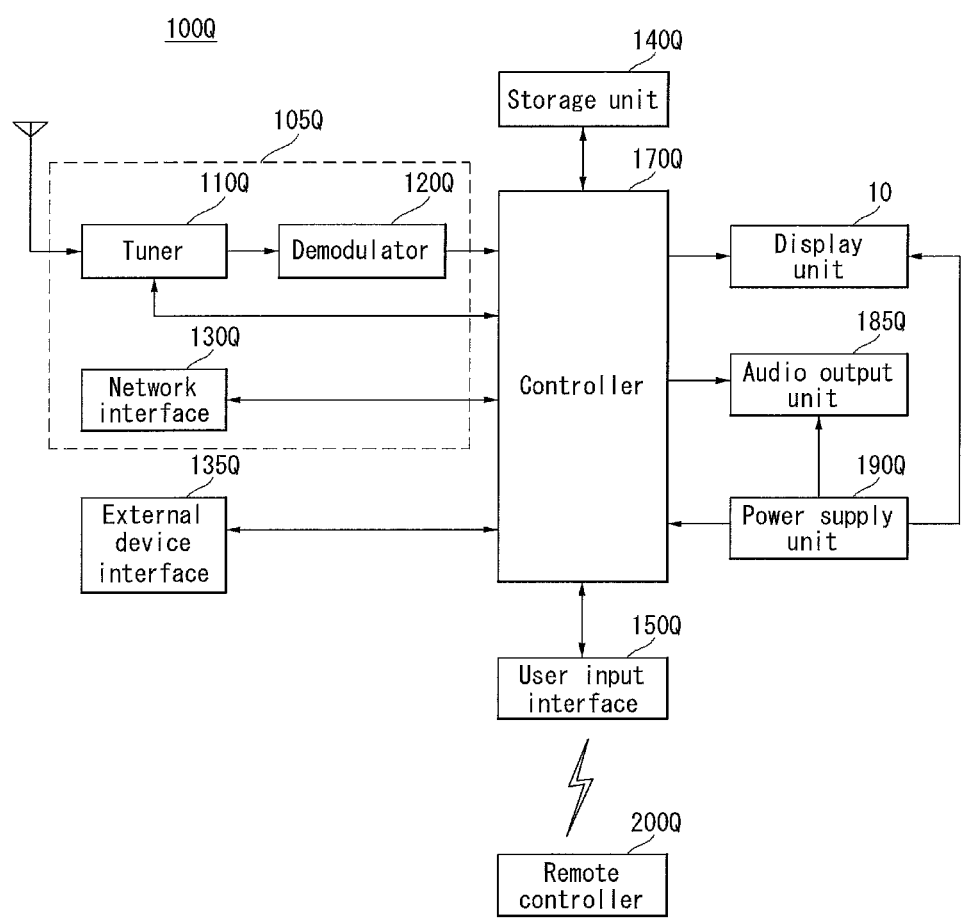
FIG. 36 illustrates another configuration of a display device according to an exemplary embodiment.

FIG. 36 illustrates another configuration of the display device according to an example embodiment. Other embodiments and configurations may also be provided. In the following description, descriptions of configuration and a structure described above may be omitted. Hereinafter, a broadcasting signal receiver may be used as an electronic device, to which the display device according to the example embodiment is applied. The display device according to the example embodiment may be applied to other electronic devices such as cellular phones.

A display unit 10 shown in FIG. 36 may correspond to the display device shown in FIGS. 1 to 35.

As shown in FIG. 36, a broadcasting signal receiver 100Q according to the example embodiment may include a broadcasting receiving unit 105Q, an external device interface 135Q, a storage unit 140Q, a user input interface 150Q, a controller 170Q, a display unit 10, an audio output unit 185Q, a power supply unit 190Q, and a photographing unit. The broadcasting receiving unit 105Q may include a tuner 110Q, a demodulator 120Q, and a network interface 130Q.

The tuner 110Q may tune a radio frequency (RF) broadcasting signal, which corresponds to a channel selected by the user or all previously stored channels, among RF broadcasting signals received through an antenna. The tuner 110Q may convert the tuned RF broadcasting signal into a middle frequency signal, a base band image signal, or a voice signal.

The demodulator 120Q may receive a digital IF signal converted by the tuner 110Q and perform a demodulating operation.

A stream signal output by the demodulator 120Q may be input to the controller 170Q. The controller 170Q may perform demultiplexing, image/voice signal processing, etc. The controller 170Q may output an image to the display unit 10 and output a voice to the audio output unit 185Q.

The external device interface 135Q may connect an external device to the broadcasting signal receiver 100Q. The external device interface 135Q may include an audio-visual (AV) input/output unit or a wireless communication unit.

The network interface 130Q may provide an interface for connecting the broadcasting signal receiver 100Q to a wired/wireless network including an internet network.

The storage unit 140Q may store a program for signal processing of the controller 170Q and control operation of the controller 170Q or may store the processed image signal, the processed voice signal, or a data signal.

The user input interface 150Q may transfer the signal the user inputs to the controller 170Q, or may transfer the signal from the controller 170Q to the user.

The controller 170Q may perform the demultiplexing processing on the stream input through the tuner 110Q, the demodulator 120Q, or the external device interface 135Q or may perform the processing of demultiplexed signals, thereby generating or outputting the signals for outputting the image or the voice.

The image signal processed by the controller 170Q may be input to the display unit 10 and may display an image corresponding to the image signal. Further, the image signal processed by the controller 170Q may be input to an external output device through the external device interface 135Q.

The voice signal processed by the controller 170Q may be output to the audio output unit 185Q. Further, the voice signal processed by the controller 170Q may be input to the external output device through the external device interface 135Q.

The controller 170Q may control the entire operation of the broadcasting signal receiver 100Q.

The display unit 10 may convert the image signal, the data signal, and an OSD signal, which are processed by the controller 170Q, or the image signal and the data signal that are received from the external device interface 135Q, into red, green, and blue signals and may generate a driving signal.

The audio output unit 185Q may receive the voice signal (e.g., stereo signal, 3.1 channel signal, or 5.1 channel signal) processed by the controller 170Q and may output the voice.

The power supply unit 190Q may supply the power required in all components of the broadcasting signal receiver 100Q.

The remote controller 200Q may transmit the user command the user inputs to the user input interface 150Q. For this example, the remote controller 200Q may use Bluetooth, RF communication, infrared communication, Ultra-wideband (UWB), Zigbee, etc.

A display device may include a display module and a back cover positioned in a rear of the display module. The display module may include a display panel that includes a front substrate and a back substrate positioned opposite the front substrate, a film attached to a front surface of the front substrate, and a frame positioned in rear of the back substrate. The film may include a first part configured to cover the front surface of the front substrate and a second part configured to extend from the first part and cover the side of the display module. At least a portion of each of the first part and the second part of the film may be exposed.

The film may be a polarizing film.

The display device may further include a structure connected to the frame. The structure may include a portion that protrudes further than the display panel in a horizontal direction. The protruding portion of the structure may include a curved surface.

The second part of the film may cover the protruding portion of the structure and may not be attached to the protruding portion of the structure.

The film may include a portion attached to the structure or the frame.

The structure may be attached to a back surface of the back substrate.

The structure may include a portion that covers the side of the front substrate or the sides of the front substrate and the back substrate.

The film may include a third part configured to extend from the second part and cover at least a portion of the rear of the display module.

At least a portion of the third part may be exposed.

The second part may include a black portion.

The film may include a film layer, an adhesive layer formed on the film layer, and a cover layer that covers the adhesive layer in an area corresponding to the second part.

The film may include a film layer and an adhesive layer formed on the film layer. The adhesive layer may be omitted in an area corresponding to the second part.

The display device may further include a resin layer formed on the side of the front substrate and/or the side of the back substrate. The film may cover the resin layer.

The resin layer may include a portion that protrudes further than a back surface of the back substrate in a vertical direction.

The display module may include a first long side, a second long side opposite the first long side, a first short side adjacent to the first long side and the second long side, and a second short side that is adjacent to the first long side and the second long side and is opposite to the first short side. At least a portion of each of the first part and the second part of the film may be exposed to the first long side, the first short side, and the second short side of the display module.

The display device may further include a bottom supporter that covers at least one of the side of the front substrate and the side of the back substrate on the second long side and is connected to the frame. The second long side may correspond to a lower part of the display module.

The film may include a portion that covers the bottom supporter.

The bottom supporter may be connected to the frame and the back cover.

A width of the second part of the film (in the vertical direction) at the second long side may be greater than a width of the second part of the film (in the vertical direction) at the first long side.

The display device may further include a fastening member configured to fasten the back cover, the film, and the frame.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications may be possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A display device comprising:
   a display panel;
   a frame positioned behind the display panel;
   a back cover positioned behind the frame;
   a first bracket fixed to the frame;
   a second bracket positioned to a side of the frame; and
   a film including a first part that covers a front surface of the display panel, a second part extended from the first part and covers a side of the second bracket, and a third part extended from the second part to the frame,
   wherein at least a portion of the first part and the second part of the film is exposed to outside of the display device,
   wherein the first bracket is positioned between the frame and the film.

2. The display device of claim 1, wherein the film includes:
   a film layer,
   an adhesive layer on the film layer, and
   a cover layer to cover the adhesive layer in an area corresponding to the second part of the film.

3. The display device of claim 1, wherein the film includes a film layer and an adhesive layer on the film layer,
   wherein the adhesive layer is not provided in an area corresponding to at least a portion of the second part of the film.

4. The display device of claim 1, further comprising
   a resin layer on a side of the display panel, wherein the film covers the resin layer.

5. The display device of claim 1, wherein the display panel includes a first long side, a second long side opposite the first long side, a first short side adjacent to the first long side and the second long side, and a second short side that is adjacent to the first long side and the second long side and the second short side is opposite to the first short side,
   wherein the second bracket is positioned to at least one of the long side and the short side.

6. The display device of claim 1, wherein the first part of the film has a transparent portion and an opaque portion,
   the transparent portion is positioned at a center of the front surface of the display panel, and
   the opaque portion is positioned at a periphery of the front surface of the display panel.

7. The display device of claim 1, wherein the first bracket is a supporter.

8. The display device of claim 1, wherein the first bracket is positioned between the frame and the third part of the film, and the first bracket is positioned to a back of the frame.

9. The display device of claim 1, wherein the first bracket fixes the film to the frame.

10. The display device of claim 1, further comprising a fastening member,
    wherein the first bracket is fixed to the frame by the fastening member.

11. The display device of claim 1, wherein the second bracket includes a curved surface,
    wherein the side of the second bracket is the curved surface.

12. The display device of claim 11, wherein the second part of the film covers the curved surface of the second bracket.

13. The display device of claim 1, wherein the second bracket includes a protrusion part extending toward inside of the display device.

14. The display device of claim 1, wherein the second bracket includes a horizontal part and a vertical part having a curved surface.

15. The display device of claim 1, wherein the second bracket is positioned adjacent to the display panel.

16. The display device of claim 1, wherein the second bracket is supported by the frame.

17. The display device of claim 1, wherein the second bracket is positioned adjacent to a back surface of the display panel.

18. The display device of claim 1, wherein the film is a polarizing film.

19. The display device of claim 1, wherein at least a portion of the third part of the film is exposed.

20. The display device of claim 1, wherein the second part of the film includes a black portion.

21. The display device of claim 3, wherein the second part of the film is not attached to the second bracket.

22. The display device of claim 5, wherein a width of the second part of the film in a vertical direction at the second long side is greater than a width of the second part of the film in the vertical direction at the first long side.

* * * * *